(12) United States Patent
Kreindl et al.

(10) Patent No.: US 10,241,398 B2
(45) Date of Patent: Mar. 26, 2019

(54) METHOD FOR APPLICATION OF AN OVERGROWTH LAYER ON A GERM LAYER

(71) Applicant: EV GROUP E. THALLNER GMBH, St. Florian am Inn (AT)

(72) Inventors: Gerald Kreindl, Scharding (AT); Harald Zaglmayr, Leonding (AT); Martin Eibelhuber, Ried im Innkreis (AT)

(73) Assignee: EV GROUP E. THALLNER GMBH, St. Florian am Inn (AT)

( * ) Notice: Subject to any disclaimer, the term of this patent is extended or adjusted under 35 U.S.C. 154(b) by 0 days.

(21) Appl. No.: 15/565,437

(22) PCT Filed: May 21, 2015

(86) PCT No.: PCT/EP2015/061251
§ 371 (c)(1),
(2) Date: Oct. 10, 2017

(87) PCT Pub. No.: WO2016/184523
PCT Pub. Date: Nov. 24, 2016

(65) Prior Publication Data
US 2018/0120695 A1    May 3, 2018

(51) Int. Cl.
*B32B 3/02* (2006.01)
*G03F 7/00* (2006.01)
(Continued)

(52) U.S. Cl.
CPC ............ *G03F 7/0002* (2013.01); *C30B 23/04* (2013.01); *C30B 25/04* (2013.01); *H01L 21/0242* (2013.01); *H01L 21/02381* (2013.01); *H01L 21/02433* (2013.01); *H01L 21/02439* (2013.01); *H01L 21/02521* (2013.01); *H01L 21/02642* (2013.01); *H01L 21/02647* (2013.01)

(58) Field of Classification Search
CPC ........ G03F 7/0002; C30B 23/04; C30B 25/04
See application file for complete search history.

(56) References Cited

U.S. PATENT DOCUMENTS

| 2013/0087526 A1* | 4/2013 | Zhu | B82Y 40/00 216/11 |
| 2015/0125976 A1* | 5/2015 | Wang | H01L 21/02381 438/26 |

(Continued)

FOREIGN PATENT DOCUMENTS

| CN | 102591142 A | 7/2012 | ............ G03F 7/00 |
| EP | 2840618 A1 | 2/2015 | ............ H01L 33/20 |

(Continued)

OTHER PUBLICATIONS

International Search Report from corresponding International Patent Application No. PCT/EP2015/061251, dated Feb. 1, 2016.

(Continued)

*Primary Examiner* — Elizabeth E Mulvaney
(74) *Attorney, Agent, or Firm* — Kusner & Jaffe

(57) ABSTRACT

A method for applying a masked overgrowth layer onto a seed layer for producing semiconductor components, characterized in that a mask for masking the overgrowth layer is imprinted onto the seed layer.

14 Claims, 4 Drawing Sheets

(51) Int. Cl.
*C30B 23/04* (2006.01)
*C30B 25/04* (2006.01)
*H01L 21/02* (2006.01)

(56) References Cited

U.S. PATENT DOCUMENTS

2015/0217505 A1   8/2015  Fischer et al. ........ B29C 59/022
2016/0251469 A1*  9/2016  Kobayashi ............ G03F 7/0002
                                                          428/195.1

FOREIGN PATENT DOCUMENTS

WO    WO 2008/115135 A1    9/2008    ............. H01L 21/20
WO    WO 2014/037044 A1    3/2014    ............... G03F 7/00

OTHER PUBLICATIONS

Saavedra et al., "Hybrid Strategies in Nanolithography," Reports on Progress in Physics, Institute of Physics Publishing, vol. 73, No. 3, Mar. 1, 2010, pp. 1-40.

* cited by examiner

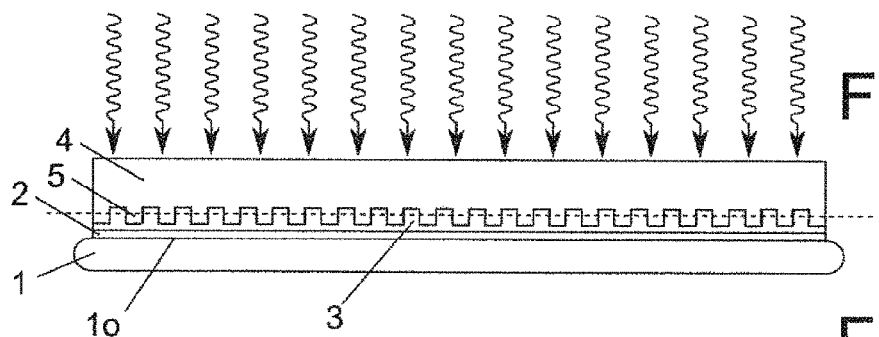
Fig. 1e
Fig. 1f
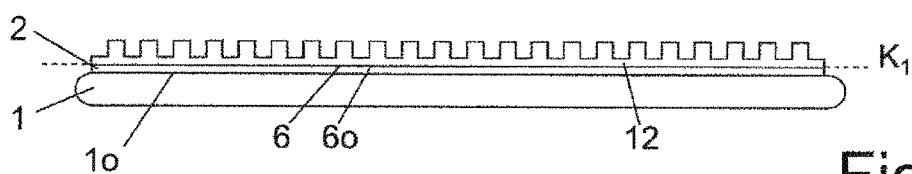
Fig. 1g
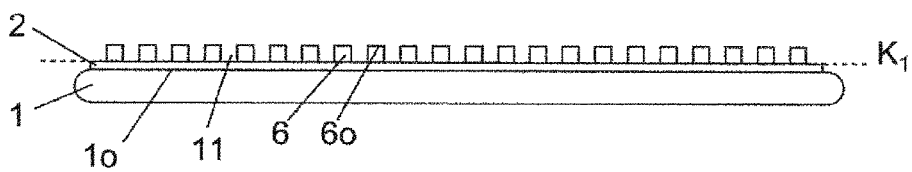
Fig. 1h
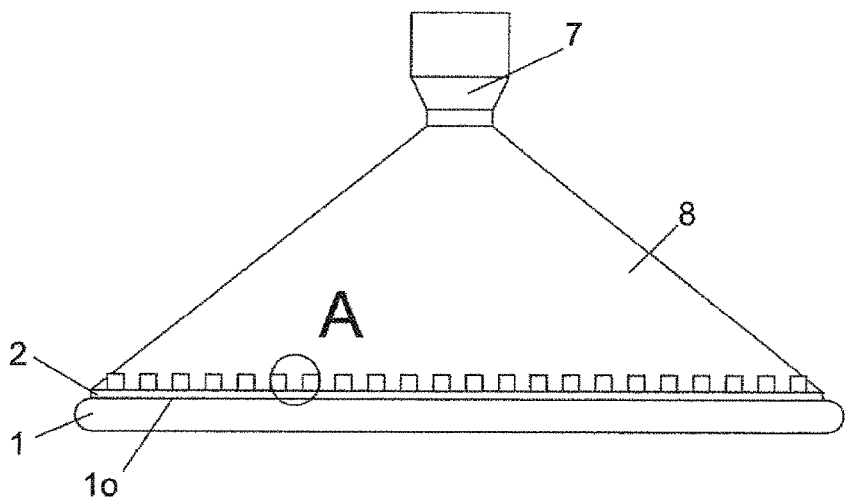

METHOD FOR APPLICATION OF AN OVERGROWTH LAYER ON A GERM LAYER

FIELD OF THE INVENTION

The invention relates to a method for applying an overgrowth layer onto a seed layer for producing semiconductor components

BACKGROUND OF THE INVENTION

In the semiconductor industry, the creation of high-purity, but above all also defect-free layers is of great importance for the production of semiconductor components. Defects, particularly crystal defects, have a decisive influence on the functionality and durability of semiconductor components. Very many semiconductor components are manufactured directly on monocrystalline substrates, which have an extremely high purity and relatively low defect density. Semiconductor substrates of such a type are produced using special processes, particularly the Czochralski process. For the most part, methods of this type create a very large single crystal, which is sawn or cut in further process steps to give the individual substrates.

Very often it is necessary to create further monocrystalline layers with a correspondingly low defect structure directly on surfaces which are already present. These monocrystalline layers may be created by different processes. In order to create high-purity and above all defect-free layers, use is very often made of the lateral overgrowth method.

In order to obtain relatively defect-free monocrystalline layers, in a first process step, a mask is created on a seed layer surface. The mask covers the majority of the seed layer surface. At well-defined locations, the mask has mask openings, via which the parts of the surface are exposed. In the prior art, the mask is predominantly produced using photolithographic methods.

For the most part, masks are produced by means of photolithographic processes with a plurality of process steps. A photoresist must be applied in a first process step. The photoresist is then exposed, developed and etched. In very many cases, it is not possible to use simple polymer-based photoresists, as the masks must be comprised of a hard material layer. Material deposition and above all the etching processes consequently become more difficult, more complicated and more expensive.

SUMMARY OF THE INVENTION

It is therefore the object of the present invention to specify a more efficient method for applying an overgrowth layer onto a seed layer.

This object is achieved with the features of the independent claim(s). Advantageous developments of the invention are specified in the dependent claims. All combinations of at least two features specified in the description, the claims and/or the figures also fall within the scope of the invention. When value ranges are given, values lying inside the limits mentioned. should also be considered as disclosed as limit values and claimable in any desired combination.

The invention is based on the idea of developing a method for applying a masked overgrowth layer onto a seed layer for producing semiconductor components in such a manner that a mask for masking the overgrowth layer is imprinted onto the seed layer.

According to an, in particular standalone, aspect, the invention relates to a method for creating masks, particularly hard masks, with the aid of an imprint technology. The masks are used for producing lateral overgrowth structures.

According to the invention, shaped epitaxial and/or monocrystalline nano dots and/or nano wires and/or other nano structures can be produced, particularly by means of the mask imprinted according to the invention.

A core of the invention comprises in particular in the application of an imprint technology and the use of suitable imprint materials as mask material, which are structured with the aid of the imprint technology and which can be converted to an oxide by means of further process steps, particularly heat treatment.

The use of imprint technologies makes most of the processes of a typical photolithographic process superfluous, as a result of which a considerable time saving and therefore a more efficient production of the semiconductor components are enabled.

The imprint compound (mask material) is applied, particularly in liquid form, onto the seed layer, and subsequently structured by means of an imprint process and converted, particularly into a hard material layer, in a further process step.

In other words or generally, or according to a standalone aspect, the invention describes a method, using which a mask can be created for producing a semiconductor component by means of imprint lithography. The mask is therefore used for producing a lateral overgrowth structure.

The overgrowth structure is preferably a monocrystalline and/or epitaxial layer of a coating material (or overgrowth layer material), which grows on a seed layer surface and this proceeds in a monocrystalline and/or epitaxial manner. According to the invention, a monocrystalline layer is particularly understood to mean a layer which does not have any grain boundaries. According to the invention, an epitaxial layer is in particular understood to mean a layer which has at least one crystal orientation, which matches the crystal orientation of the surface, on which it grows (seed layer).

The layer or layer surface, starting from which the monocrystalline and/or epitaxial layer according to the invention starts to grow, is termed the seed layer or seed layer surface.

Substrates

The substrates are preferably wafers. The wafers are standardized substrates with well-defined, standardized diameters. However, the substrates can generally have any desired shape. The diameters of the substrates can generally take on any desired size, but preferably have one of the standardized diameters of 1 inch, 2 inches, 3 inches, 4 inches, 5 inches, 6 inches, 8 inches, 12 inches and 18 inches, as well as 125, 150, 200, 300 or 450 mm.

Preferably,
  silicon or
  sapphire are used as substrate materials.

In the remainder of the patent specification, mention is generally made of substrates. In particular, however, the embodiments according to the invention predominantly relate to wafers.

Imprint Stamp

Different imprint stamps can be used for the process according to the invention. The imprint stamp can be a hard stamp, a soft stamp or a foil stamp.

A hard stamp is understood to mean a stamp, which has been manufactured from a material with a high modulus of elasticity (Young's modulus). The Young's modulus of the hard stamp in particular lies between 1 GPa and 1000 GPa, preferably between 10 GPa and 1000 GPa, with greater preference between 25 GPa and 1000 GPa, with most preference between 50 GPa and 1000 GPa, and most preferably between 100 GPa and 1000 GPa. The Young's modulus of some steel grades is about 200 GPa, for example. Preferred materials for hard stamps are:
- metals, in particular
  - metal alloys, particularly steels,
  - pure metals, particularly Ni, Cu, Co, Fe, Al and/or W,
- ceramics, particularly glasses, preferably
  - metallic glasses or
  - non-metallic glasses, particularly
- organic non-metallic glasses or
- inorganic non-metallic glasses, particularly
  - non-oxide glasses, particularly halide glasses or chalcogenide glasses, or
  - oxide glasses, particularly phosphate glasses or silicate glasses, particularly aluminosilicate glasses or lead silicate glasses or alkali silicate glasses, preferably alkaline earth silicate glasses, or borosilicate glasses or borate glasses, preferably alkali borate glasses, or
- alloys A soft stamp is understood to mean a stamp which has been manufactured from a material with a low Young's modulus. The Young's modulus in particular lies between 1 GPa and 1000 GPa, preferably between 1 GPa and 500 GPa, with greater preference between 1 GPa and 100 GPa, with most preference between 1 GPa and 10 GPa, most preferably between 1 GPa and 5 GPa. The Young's modulus of polyamides preferably lies between 3 GPa and 6 GPa. Preferred materials for soft stamps are:
- PFPE
- silicates, particularly
  - acrylic-containing and/or epoxy-containing silicates and/or
  - PDMS and/or
  - SSQ, particularly POSS.

A foil stamp is understood to, mean a stamp, which includes a foil, which is pressed into the imprint compound (mask material) by means of a further loading device, particularly a roller. A foil stamp is disclosed in the published document WO2014/037044A1, to which reference is made. In the sense of the definition of a soft stamp, the film stamp may also be considered as a soft stamp. Due to the lower bending resistance thereof, caused in particular by a small thickness of the film, the film stamp can be considered as a separate stamp type or as an advantageous design of a soft stamp.

Seed Layer

The seed layer is either a layer applied onto a substrate, or the substrate constitutes the seed layer itself. The seed layer is preferably monocrystalline and/or epitaxial.

The seed layer surface particularly has a very low roughness. The roughness is either specified as mean roughness, root mean square roughness or as mean roughness depth. The determined values for the mean roughness, the root mean square roughness and the mean roughness depth differ in particular for the same measured distance or measured area, but preferably lie in the same order of magnitude. Therefore, the following ranges of numerical values for the roughness are to be understood either as values for the mean roughness, the root mean square roughness or for the mean roughness depth. As the seed layer surfaces are preferably monocrystalline and/or epitaxial layers, the classical concept of roughness possibly cannot be applied here. The specified roughness values are in particular to be understood to mean the height difference between the deepest plane exposed at least at one point, and the uppermost crystallographic plane of the seed layer surface.

The roughness of the seed layer surface is in particular smaller than 1 µm, preferably smaller than 100 nm, more preferably smaller than 10 nm, most preferably smaller than 1 nm, most preferably of all smaller than 0.1 nm.

The preferred crystallographic orientations of the seed layer are the {100} and the {111} orientation, particularly for materials with a cubic crystal lattice. Further conceivable and preferred crystallographic orientations are {110}-, {211}-, {221}- and {311}-orientations.

Preferred seed layer materials are
- metals, particularly Cu, Ag, Au, Al, Fe, Ni, Co, Pt, W, Cr, Pb, Ti, Sn and/or Zn,
- semiconductors, particularly Ge, Si, α-Sn, fullerenes, B, Se, Te
- compound semiconductors, particularly GaAs, GaN, InP, $InxGa_{(1-x)}N$, InSb, InAs, GaSb, AlN, InN, GaP, BeTe, ZnO, $CuInGaSe_2$, ZnS, ZnSe, ZnTe, CdS, CdSe, CdTe, $Hg_{(1-x)}Cd(x)Te$, BeSe, HgS, $AlxGa_{(1-x)}As$, GaS, GaSe, GaTe, InS, InSe, InTe. $CuInSe_2$, $CuInS_2$, $CuInGaS_2$, SiC, SiGe.
- sapphire Particularly preferred seed layer materials according to the invention are: Si, sapphire.

Imprint Material/Mask Material

Basically, any type of material can be used as imprint material/mask material for forming the mask, which
- can be deposited on a surface, particularly wet-chemically, and/or
- can be structured by means of lithography, particularly imprint lithography, preferably nano imprint lithography, and in particular enables a correspondingly high resolution of the structures, particularly micro and/or nano structures, and/or
- can be etched in the case of a residual layer, which is present, and/or
- withstands the coating temperatures of the coating material without decomposing and/or deforming and/or reacting excessively with the coating material, and/or
- preferably can remain incorporated in the epitaxial layer crated, without negatively influencing the properties thereof.

Under all possible material classes, silsesquioxanes (SSQs), particularly polyhedral oligomeric silesquioxanes (POSSs) are suitable in particular according to the invention, as they
- can be deposited wet chemically on a surface,
- can easily be structured by imprint processes,
- can be cured thermally and/or electromagnetically, and/or
- can be converted into glass, which is very chemically and physically inert.

The invention is further based on the, in particular standalone, idea of producing an imprint compound from a special mixture. The mixture includes at least one main component and at least one secondary component. The main component is preferably a silesquioxane. Furthermore, the following materials would also be conceivable according to the invention:
- polyhedral oligorneric silesquioxane (TOSS)
- polydimethylsiloxane (PDMS)
- tetraethyl orthosilicate (TEOS)
- poly(organo)siloxanes (silicone)
- perfluoropolyether (PFPE)

The secondary components can include any desired organic and/or inorganic compound. These secondary components can have any desired complicated, preferably organic, structure. Accordingly, compounds can be composed of a combination of the elements from the following list. All of the chemical compounds occurring in the list can of course be present as monomers or polymers. At least one of the secondary components is preferably an organic compound, particularly one of the following compounds:
acrylic or (poly)acrylate
epoxides
epoxy resins
phenols
alkane
aerie
alkine
benzene
ether
ester
carboxylic acid
ketone
alcohol.

In a very particular embodiment, the secondary component can belong to the same functional group as the organic, functional group of the main component. In a further particular embodiment, the secondary embodiment may already have been joined to the main component by means of a chemical reaction, particularly by means of an addition and/or condensation and/or substitution reaction.

Solvents are always used, in order to dissolve the main component, the initiators and the organic component according to the invention, with the aid of which the setting and/or influencing of the hydrophilicity of or hydrophobia takes place. Preferably, the solvents are preferably removed from the imprint compound according to the invention during the course of the production process of the actual structure, or leak out by themselves.

One of the following solvents is preferably used:
acetone
acetonitrile
aniline
cyclohexane
n-pentane
triethylene glycol dimethyl ether (Triglyme)
dimethylacetamide
dimethyl formamide
dimethyl sulphoxide
1,4-dioxane
glacial acetic acid
acetic anhydride
ethyl acetate
ethanol
ethylene dichloride
ethylene glycol
Anisole
benzene
benzonitrile
ethylene glycol dimethyl ether
petroleum ether/light petroleum
piperidine
propanol
propylene carbonate (4-methyl-1,3-dioxol-2-one)
pyridine
γ-butyrolactone
quinoline
chlorobenzene
Chloroform
n-heptane
2-propanol (isopropyl alcohol)
methanol
3-methyl-1-butanol (isoamyl alcohol)
2-methyl-2-propanol (tert-butanol)
methylene chloride
methyl ethyl ketone (butanone)
N-methyl-2-pyrrolidone (NMP)
N-methyl formamide
tetrahydrofuran
ethyl lactate
toluene
dibutyl ether
diethylene glycol
diethyl ether
bromobenzene
1-butanol
tert-butyl methyl ether (TBME)
triethylamine
triethylene glycol
formamide
n-hexane
nitrobenzene
nitromethane
1,1,1-trichloroethane
trichloroethene
Carbon disulphide
Sulfolane
tetra-chloroethene
carbon tetrachloride
Propylene glycol monomethyl ether acetate (PGMEA)
Water.

The main components and the secondary components are mixed together with initiators, which start the chain reactions, in a correspondingly stoichiometrically correct ratio. By mixing the main component with the secondary component and the initiator, polymerization occurs when the initiator is activated, particularly or at least predominantly between organic portions of the main components. It may be that the secondary components take part to some extent in the polymerization. In particular, only the main components polymerize with one another. Long-chain molecules and/or entire 2D and/or 3D-networks are created during the polymerization, preferably with a specifically adjustable number of monomers. In this case, the number of monomers is greater than 1, preferably greater than 10, more preferably greater than 100, most preferably greater than 1000, most preferably of all, the monomers polymerize to form a complete 2D and/or 3D network.

In the following, the words imprint material and mask material are used as synonyms.

Coating Material (Also Overgrowth Material)

The coating material is semiconductor materials in particular. The coating material is preferably identical to the seed layer material, so that the seed layer merges by means of the process according to the invention, preferably seamlessly, by means of overgrowth of the mask openings into the overgrowth layer to be created. However, seed layer material and coating material can also be different.

The following materials in particular are considered as coating materials and/or seed layer materials:
metals, particularly Cu, Ag, Au, Al, Fe, Ni, Co, Pt, W, Cr, Pb, Ti, Sn and/or Zn,
semiconductors, particularly Ge, Si, α-Sn, fullerenes, B, Se, Te
compound semiconductors, particularly GaAs. GaN, InP, InxGa(1-x)N, InSb, InAs, GaSb, AlN, InN, GaP, BeTe, ZnO, CuInGaSe2, ZnS, ZnSe, ZnTe, CdS, CdSe, CdTe, Hg(1-x)Cd(x)Te, BeSe, HgS, AlxGa(1-x)As, GaS, GaSe, GaTe, InS. InSe, InTe, CuInSe2, CuInS2, CuInGaS2, SiC, SiGe.
sapphire According to the invention, preferred materials are: Si, GaAs, GaN, InP, $In_xGa_{(1-x)}N$, InSb, InAs.

Process

In a preferred, particularly first, process step according to the invention, a substrate is provided with a seed layer surface, The seed layer surface can either be the surface of a seed layer deposited on the substrate, or the substrate surface itself, which is comprised of the substrate material in particular, is used as seed layer surface. The seed layer surface is used during the application of the overgrowth layer, particularly as nucleation point for the, in particular monocrystalline and/or epitaxial, overgrowth layer to be created. Preferably, the seed layer comprises the same material as the coating material, from which the overgrowth layer is created. However, according to the invention, the use of different materials is also conceivable. Above all, it is important that the seed layer ensures the nucleation of the overgrowth layer and according to the invention, access to the seed layer surface exists in particular in regions at which the overgrowth layer should grow.

In specific embodiments, which are preferred according to the invention, the seed layer can therefore only be applied at defined locations on a substrate surface and therefore not over the entire surface.

In a further, particularly second, process step, which is preferred according to the invention, the mask material is deposited onto the seed layer surface. The application can take place in particular by means of the following listed methods:

physical deposition methods, particularly PVD, and/or
chemical deposition methods, particularly CVD, preferably PE-CVD, and/or
wet-chemical deposition methods, and/or
coating, particularly spin coating or spray coating.

In a further, particularly third, process step, which is preferred according to the invention, an imprint stamp is positioned above the deposited mask material. In particular embodiments, the imprint stamp is aligned relatively to the substrate and/or to the seed layer surface. In particular, the alignment takes place on the basis of alignment marks.

In a further, particularly fourth, process step, which is preferred according to the invention, the mask material is structured. According to the invention, the structuring preferably takes place by means of an imprint lithography method, most preferably by means of a nano imprint lithography method. The aim of the imprint lithography method is the structuring of the mask material. The mask material should be structured in such a manner that in a minimum number of structuring steps, a layer with defined number of mask passages/mask openings per unit area. The number of structuring steps is in particular smaller than 10, preferably smaller than 5, more preferably smaller than 3 and most preferably smaller than 3. The number of mask passages/mask openings is in particular greater than 1 per $m^2$, preferably greater than $10^3$ per $m^2$, more preferably greater than $10^7$ per $m^2$, most preferably greater than $10^{11}$ per $m^2$, most preferably of all greater than $10^{15}$ per $m^2$.

In a preferred embodiment, the raised structures of the imprint stamp displace the mask material as far as the stop of the structures at the seed layer surface. As a result, the formation of a residual layer is prevented and the desired mask structure is imprinted directly. It is then possible to dispense with a subsequent etching step for exposing the regions of the seed layer surface to be coated with the overgrowth layer material.

In a further, particularly fifth, process step, which is preferred according to the invention, the mask material is cured.

According to a first, less preferred, embodiment of the curing, the mask material is thermally hardened. The thermal hardening takes place by supplying heat. The temperature at the mask material is particularly more than 50° C., preferably more than 100° C., more preferably more than 250° C., more preferably more than 500° C. and more preferably more than 750° C. A preferred temperature lies between 500° C. and 600° C. By choosing special thermal initiators, it is possible to drastically lower the temperature range. A more preferred temperature in this case lies between 50° C. and 200° C. In the event of a thermal curing, the heat can be introduced via the substrate and/or the stamp. If the heat is introduced via the stamp, the stamp should have a highest possible thermal conductivity, a lowest possible heat capacity and/or a lowest possible coefficient of thermal expansion.

In a second and preferred embodiment of the curing, the curing takes place by means of electromagnetic radiation. In this case, the substrate and/or the stamp are at least partially, preferably predominantly, transparent for the respective wavelength range. Particularly preferably, the imprint stamp has the above transparency, so that any desired substrates can be used. If the curing takes place by means of ultraviolet light (UV light, preferably), then the electromagnetic radiation particularly has a wavelength in the range between 10 nm and 2000 nm, preferably between 10 nm and 1500 nm, more preferably between 10 nm and 1000 nm, most preferably between 10 nm and 500 nm, most preferably of all between 10 nm and 400 nm.

Curing is usually associated with the production of gases. These gases are preferably driven out before overgrowth of the mask, in order to avoid bubble formation. In a particularly preferred embodiment according to the invention, the curing of the mask takes place in the coating chamber, particularly at the same time as the coating. As a result, it becomes possible to save on an additional process step. The curing of the mask in the coating chamber is preferably carried out if (i) the coating temperature is above the curing temperature, particularly the temperature which allows a complete outgassing of the mask, and/or
(ii) the outgassing process has finished before the overgrowth.
Should at least one of these points be unfulfillable, then the mask is cured before the coating in its own, separate heat-treatment step.

Although no thermal radiant heat is preferably introduced into the system during curing by means of electromagnetic radiation, indirect heating of the imprint stamp by means of interaction with the electromagnetic radiation may take place. Therefore, the following parameter sets for the imprint stamp apply, independently of the type of curing.

The thermal conductivity of the imprint stamp should be as high as possible, in order to ensure a fastest possible heat transport. The thermal conductivity in particular lies between 0.1 W/(m*K) and 5000 W/(m*K), preferably between 1 W/(m*K) and 5000 W/(m*K), more preferably between 100 W/(m*K) and 5000 W/(m*K), most preferably between 400 W/(m*K) and 5000 W/(m*K).

The heat capacity of the imprint stamp is as small as possible, in order to prevent storage of the heat. For most solid bodies, at moderate temperatures and pressures, the heat capacitance at constant volume only differs marginally from the heat capacitance at constant pressure. Therefore, in the remainder of the patent specification, no distinction is made between the two heat capacitances. Furthermore, specific heat capacitances are specified. The specific heat capacitance of the imprint stamp is in particular lower than 20 kJ/(kg*K), preferably lower than 10 kJ/(kg*K), more preferably lower than 1 kJ/(kg*K), most preferably lower than 0.5 kJ/(kg*K), absolutely most preferably lower than 0.1 kJ/(kg*K).

The coefficient of thermal expansion of the imprint stamp should be a as small as possible, in order to minimize distortion of the imprint stamp by means of the high temperature differences. The coefficient of thermal expansion is in particular lower than $10^{-4}$ $K^{-1}$, preferably lower than $5*10^{-5}$ $K^{-1}$, more preferably lower than $10^{-5}$ $K$ $K^{-1}$, most preferably lower than $5*10^{-6}$ $K^{-1}$, most preferably lower than $10^{-6}$ $K^{-1}$, most preferably of all lower than $10^{-7}$ $K^{-1}$.

In a further, in particular sixth, process step preferred according to the invention, the demoulding of the imprint stamp takes place from the mask material or from the cured mask. The demoulding of the imprint stamp preferably takes place without destruction of the imprinted structures of the imprint material. Hard stamps may lead to a destruction of the imprinted structures during the demoulding. Preferably, therefore, soft stamps are sued for the imprinting and also demoulding. More preferably, foil stamps are used. These are preferably pulled off and therefore allow a more efficient separation of imprint stamp and mask.

In a further, in particular seventh, process step, preferred according to the invention, the etching of the residual layer takes place as soon as a residual layer of such a type is present. Preferably, this residual layer is formed to be as thin as possible. The thinner the residual layer is, the faster the etching process can be carried out. The residual layer thickness is in particular smaller than 1 μm, preferably smaller than 100 nm, more preferably smaller than 10 nm, most preferably smaller than 1 nm. One or more of the following are suitable as etching chemicals:

inorganic acids, particularly HF, HCl, $H_2SO_4$, $HNO_3$ and/or $H_3PO_4$, organic acids, particularly formic acid and/or citric acid.

In a preferred, particularly eighth, process step according to the invention, the accessible regions of the seed layer surface are coated. The coating takes place in particular by deposition of components (overgrowth layer material), particularly atoms, onto the seed layer surfaces, which are accessible through the mask openings. In the process, components are in particular also deposited on the mask surface. Therefore, components with extremely high mobility are chosen. These diffuse from the mask surface into the mask openings and are then preferably deposited on the seed surface layer, so that continuous filling of the mask openings occurs at the seed layer which is growing into the mask openings and preferably upwards, whilst the mask surface remain substantially, preferably completely, free from the coating material.

The coating process preferably takes place at high temperatures. The coating temperature is in particular greater than 50° C., preferably greater than 200° C., more preferably greater than 500° C., more preferably greater than 1000° C. and more preferably greater than 1500° C.

The growth of the overgrowth layer preferably takes place at different stages. These can be described in successive intervals with times which are described in more detail in the following.

The growth processes preferably take place in accordance with one of the layer growth types listed in the following:

Volmer-Weber growth, and/or

Frank-van der Merwe growth and/or

Stranski-Krastanov growth

At a first coating time (or interval), a nucleation of the components takes place at the original seed layer surface of the seed layer, which represents the first seed layer.

Owing to the extremely high coating temperatures, particularly parallel to the layer growth, an outgassing of the mask material takes place at this time. The outgassing should be completely finished before the layer growth, as otherwise the quality of the layer suffers as a result of the outgassing. The outgassing can in particular be traced to the escape of inorganic and/or organic components, above all in the case of SSQ materials. Due to the outgassing and combustion of the organic components, particularly in the SSQ material, the continuous SSQ material is converted into a hard material, particularly a pure silicon dioxide material. This outgassing process should therefore be carried out by means of an own separate process step, before the coating (eighth process step) is carried out. In a further conceivable, but less preferred embodiment, coating and outgassing take place simultaneously, as the coating nonetheless takes place at high temperatures and is accelerated by consolidating the process and less energy is consumed.

At a second coating time (or interval), the overgrowth layer grows inside the mask opening in the direction of the mask surface. Preferably, this growth takes place in such a manner that a drop in the fault density, particularly the dislocation density, can be detected with increasing distance from the seed layer surface. The dislocation density, is particularly smaller than $10^{17}$ $cm^{-2}$, preferably smaller than $10^{15}$ $cm^{-2}$, more preferably smaller than $10^{13}$ $cm^{-2}$, more preferably smaller than $10^{11}$ $cm^{-2}$, more preferably smaller than $10^9$ $cm^{-2}$, most preferably smaller than 10 $cm^{-2}$. At the same time, the outgassing or the combustion of the organic components of the mask material proceeds. The outgassing or combustion is preferably completed before the growth of the overgrowth layer up to the mask surface, in order to minimize or, to the greatest extent possible, to prevent inclusion of gases in the overgrowth layer.

At a third coating time (or interval), the seed layer reaches the mask surface and begins lateral expansion and the formation of the remaining overgrowth layer, which proceeds beyond the mask surface and in particular forms a closed, non-masked region of the overgrowth layer. Preferably, the fault density, particularly the dislocation density, reaches a minimum from this time. The dislocation density, is particularly smaller than $10^{11}$ $cm^{-2}$, preferably smaller than $10^9$ $cm^{-2}$, more preferably smaller than $10^7$ $cm^{-2}$, more preferably smaller than $10^5$ $cm^{-2}$, more preferably smaller than $10^3$ $cm^{-2}$, most preferably smaller than $10^1$ $cm^{-2}$.

In a further preferred, particularly ninth, process step according to the invention, the overgrowth layer is allowed to grow to the desired height (by means of further loading with overgrowth material), in order to obtain the desired end product according to the invention with a defined thickness or a defined layer. The end product according to the invention is composed of at least one mask, which has been structured by means of imprint technology, and is surrounded by an overgrowth layer, particularly completely.

In a further, optional, particularly tenth, process step, particularly after processing has taken place, the newly created surface of the overgrowth layer can be bonded to an (if appropriate further) carrier substrate.

In a further, optional, in particular eleventh, process step, the first carrier substrate can be removed. Alternatively or additionally, the rear side (that is to say the side of the seed layer) can be thinned. During back thinning, a complete removal of the mask by means of the grinding process is possible. The complete removal of the mask only takes place if the structures which have grown therebetween are not used as nano dot and/or nano wire structure. In this specific case, one would have transferred a monocrystalline and/or epitaxial layer, which does not have many voids in particular, onto the surface of a second substrate by means of a layer transfer process.

Further features and embodiments of the invention result from the claims and the following description of the figures for the drawing.

BRIEF DESCRIPTION OF THE DRAWINGS

FIG. 1b shows a schematic cross-sectional illustration, which is not true to scale, of a second process step of the embodiment according to FIG. 1a, FIG. 1c shows a schematic cross-sectional illustration, which is not true to scale, of a third process step of the embodiment according to FIG. 1a.

DETAILED DESCRIPTION OF THE INVENTION

In the figures, the same components or components with the same function are labelled with the same reference numbers.

All of the figures shown exclusively constitute schematic illustrations, which are not true to scale, of conceivable process steps according to the invention. In particular, the order of magnitude of the structures of a mask 6 for masking a seed layer 2 lie in the micro- and/or nanometre range. An overgrowth layer 14 is applied onto the mask 6 and the seed layer 2.

Figure 1A:
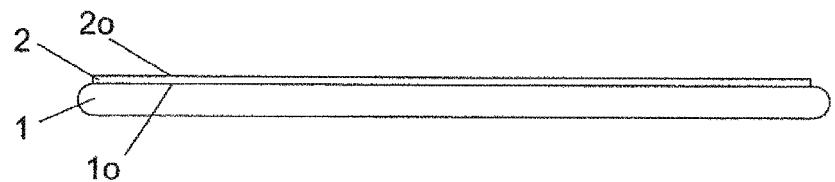
FIG. 1a shows a schematic cross-sectional illustration, which is not true to scale, of a first process step of an embodiment of a method according to the invention.

FIG. 1a shows a cross-sectional illustration of a substrate 1 with a substrate surface 1o, on which the seed layer 2 is or has been deposited in a first process step with a seed layer surface 2o. According to an alternative embodiment, the substrate 1 itself can be the seed layer 2. The seed layer 2 is preferably monocrystalline, more preferably monocrystalline and epitaxial. It is possible in particular to influence the crystal orientation of the seed layer 2 by means of the deposition method. A (100) and/or a (111) crystal orientation are preferred. In this case, a (hkl) orientation is understood to mean a crystal orientation in which the hkl planes lie parallel to the surface to of the substrate 1. The hkl indices are the Miller indices.

Figure 1B:
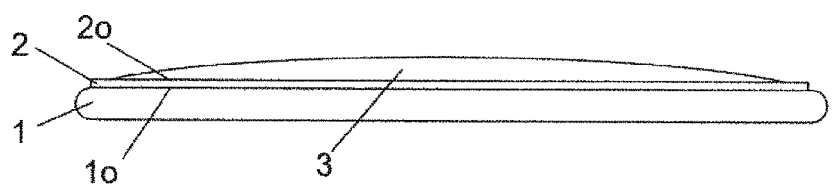

FIG. 1b shows a second process step, in which a mask material 3 is deposited on the surface of the seed layer 2. The deposition can take place by means of all known deposition methods.

As the mask material 3 is preferably deposited in a liquid manner, particularly as a sol gel, the mask material 3 is illustrated with a convexly curved surface curvature (illustrated in an exaggerated manner).

Figure 1C:
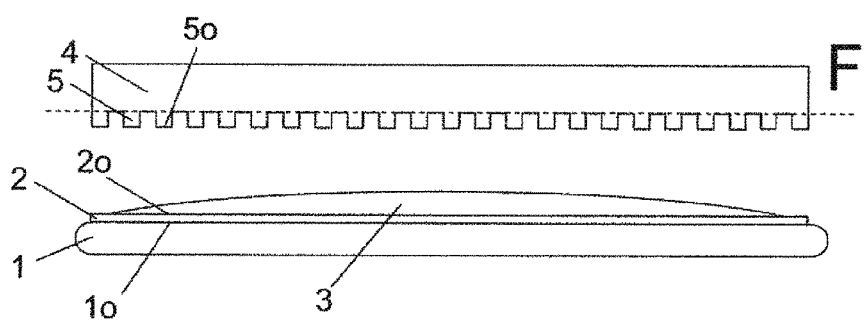

In a further process step according to FIG. 1c, a positioning of an imprint stamp 4 above the mask material 3 takes place. The imprint stamp 4 can in particular be orientated and aligned relatively to the substrate 1 and/or relatively to the seed layer 2. An alignment preferably takes place on the basis of alignment marks (not drawn in), if these are present. In the case of unstructured substrates, however, a purely mechanical alignment is preferably carried out.

Figure 1D:
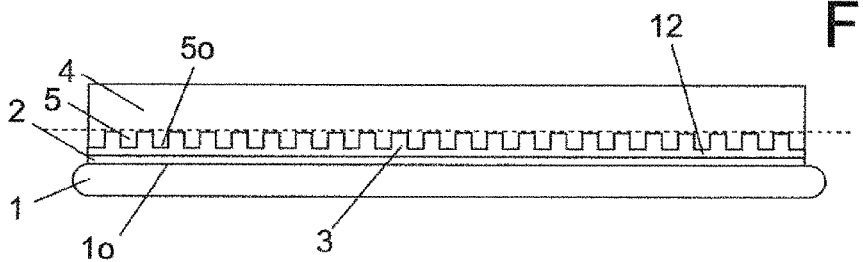
FIG. 1d shows a schematic cross-sectional illustration, which is not true to scale, of a fourth process step of the embodiment according to FIG. 1a, FIG. 1e shows a schematic cross-sectional illustration, which is not true to scale, of a fifth process step of the embodiment according to FIG. 1a, FIG. 1f shows a schematic cross-sectional illustration, which is not true to scale, of a sixth process step of the embodiment according to FIG. 1a, FIG. 1g shows a schematic cross-sectional illustration, which is not true to scale, of a seventh process step of the embodiment according to FIG. 1a, FIG. 1h shows a schematic cross-sectional illustration, which is not true to scale, of an eighth process step of the embodiment according to FIG. 1a, FIG. 1i shows a schematic, enlarged cross-sectional illustration, which is not true to scale, of FIG. 1h.

In a further process step according to FIG. 1d, the mask material 3 is structured in such a manner by the imprint stamp 4 that mask passages 11, preferably mask openings reaching as far as the see layer 2, are formed. The diameter d of the mask passages 11 is in particular smaller than 10 mm, preferably smaller than 1 mm, more preferably smaller than 100 µm, most preferably smaller than 10 µm, most preferably of all smaller than 1 µm. The depth t of the mask passages 11 is in particular smaller than 100 µm, preferably smaller than 10 µm, more preferably smaller than 1 µm, most preferably smaller than 100 nm, most preferably of all smaller than 10 nm. In particular, the depth t of the mask passages 11 therefore corresponds to the layer thickness of the mask 6. In particular, the ratio between the diameter d and the depth t is greater than 1, preferably greater than 10, more preferably greater than 100, most preferably greater than 200, most preferably of all greater than 300.

The mask opening therefore preferably has a diameter d which is larger than or the same size as the depth t.

A curing of the mask material 3 is illustrated in FIG. 1e. The curing can take place thermally and/or chemically and/or electromagnetically. Preferably, the curing takes place electromagnetically, more preferably by means of UV light. The advantage of a curing by means of electromagnetic radiation is the vanishingly small or practically negligible extent of the mask material 3, whilst a thermal curing can cause a thermal expansion, which is not insignificant and could damage and/or displace the structures.

FIG. 1f illustrates a demoulding step. After demoulding, the mask 6 remains on the seed layer 2. If the mask passages 11 of the mask 6 do not reach as far as the seed layer 2 after the demoulding of the imprint stamp 4, that is to say a residual layer 12 is present, an additional etching step (cf. FIG. 1g) is carried out. The residual layer 12 is removed by means of this etching step, particularly in the region of the mask passages 11, in order to expose the seed layer 2 in the region of the mask passages 11. Preferably, the creation of the residual layer 12 is avoided during the imprint step, in that the imprint stamp 4 proceeds as far as the seed layer 4 and displaces the mask material 3 in the region of the mask passages 11.

In a further process step according to FIG. 1h, the coating takes place by means of a coating system 7, particularly at a high temperature. A process chamber (not illustrated), in which the coating takes place, is therefore heated before the coating. During the coating, a coating material 8m, which is preferably identical to the seed layer material of the seed layer 2, makes it via a material flow 8 through the mask passages 11 to the seed layer surface 2o of the seed layer 2. The coating material 8m crystallizes at the seed layer surface 2o.

Gases 13, brought about by the high temperature during coating, escape from the mask material 3, which gases lead to a curing of the mask material 3, it is conceivable that the coating temperatures are not sufficient to drive the gases 13 out of the mask material 3. In such a case, the mask material 3 is thermally treated before the overgrowth according to the invention until all gases 13 have been driven out of the mask material 3.

Figure 1I:
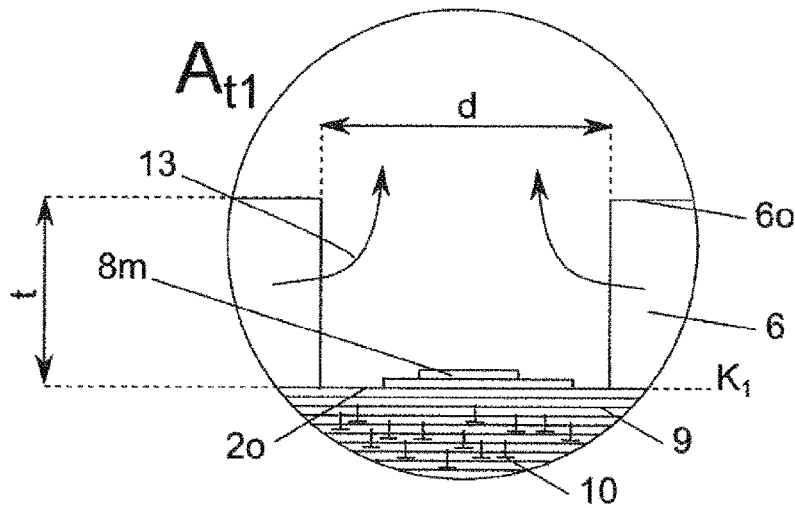

FIG. 1i shows an enlargement, which is not true to scale, of a region A (FIG. 1h) of one of the mask passages 11 at a first time t1. The mask passage 11 has the structure size d. In the case of a radially symmetrical mask passage 11, d would be the diameter of the mask passage 11 parallel to the substrate surface 1o. The coating material 8m is limited, by means of the structure size d, in terms of the seed formation thereof to a part of the seed layer surface 2o. The material deposition of the coating material 8m preferably takes place epitaxially. This means that the coating material 8m retains the crystallographic orientation (hkl) of the seed material surface 2o during the growth thereof. At this time, the growth of the coating material 8m begins in a seed plane K1, which coincides with the seed surface 2o of the seed layer 2.

Figure 1J:
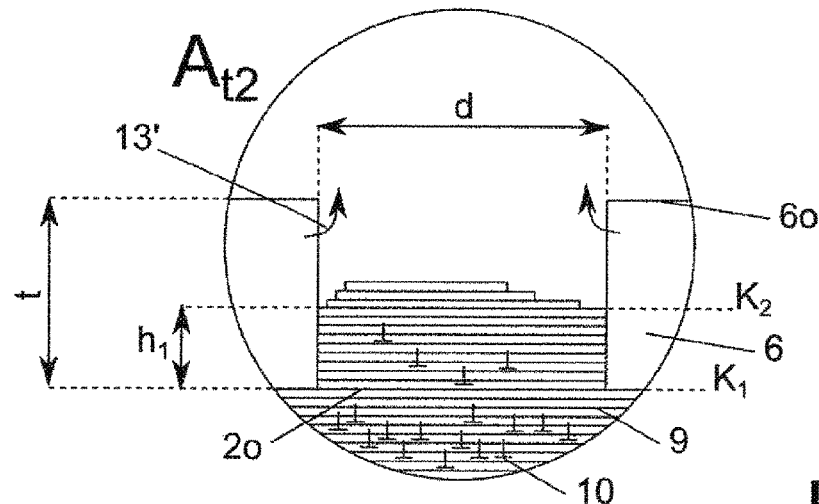
FIG. 1j shows a schematic, enlarged cross-sectional illustration, which is not true to scale, of FIG. 1h.

FIG. 1j shows an enlargement, which is not true to scale, of the region A of a mask passage 11 at a second time t2. At this time, the coating material 8m has already grown to a height h1. A new (higher) seed plane K2 has been created at a distance form the original seed surface 2o. A characteristic feature exists in that the fault density, particularly the dislocation density of the dislocations 10, decreases with increasing distance from the original seed surface 2o. The upwardly growing, particularly monocrystalline and/or epitaxial layer therefore becomes ever more perfect with increasing distance from the original seed surface 2o.

Figure 1K:
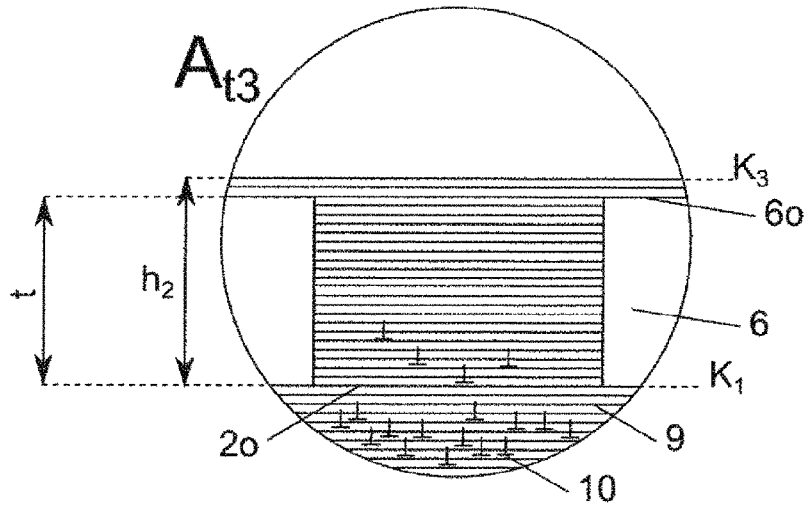
FIG. 1k shows a schematic, enlarged cross-sectional illustration, which is not true to scale, of FIG. 1h.

FIG. 1k shows the state of an overgrowth of the overgrowth layer 14 over the mask 6 up to a third time t3, at which a seed plane K3 lies over the mask surface 6o. The coating material 8m has been distributed over all mask openings 11, particularly uniformly. The void density, particularly the dislocation density of the dislocations 10, reaches a minimum and is preferably negligibly small. Therefore, by means of the process according to the invention, a whole area, monocrystalline, particularly epitaxial and fault-free, layer 14 is created.

Figure 1L:
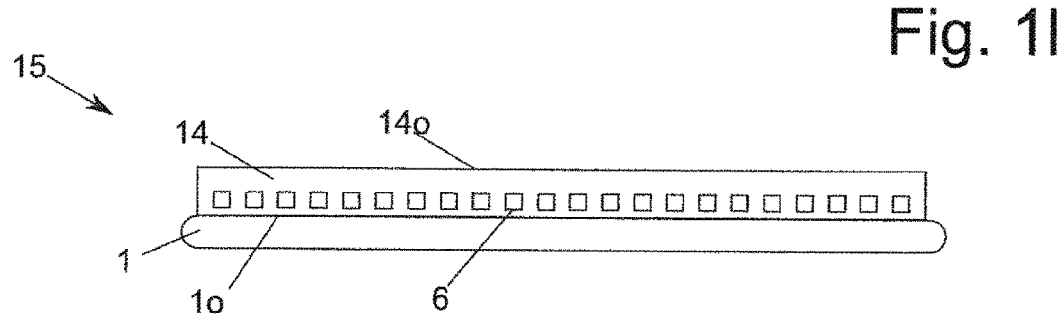
FIG. 1l shows a schematic cross-sectional illustration, which is not true to scale, of a ninth process step of the embodiment according to FIG. 1a, FIG. 1m shows a schematic cross-sectional illustration, which is not true to scale, of an optional tenth process step of the embodiment according to FIG. 1a, FIG. 1n shows a schematic cross-sectional illustration, which is not true to scale, of an optional eleventh process step of the embodiment according to FIG. 1a, and FIG. 2 shows a schematic cross-sectional illustration, which is not true to scale, of a specific embodiment according to the invention.

FIG. 1l shows an end product 15 according to the invention, comprising a substrate 1 and a new, particularly monocrystalline and/or epitaxial overgrowth layer 14, which is preferably fault-free on an upper side 14o, The end product 15 can be used as a starting point for further processing. Seed layer 2 and overgrowth layer 14 can in particular be differentiated from one another by means of the void density or dislocation density.

The overgrowth layer 14 has completely enclosed the mask 6 preferably over the entire area, preferably completely. Using the process according to the invention, it is not only possible for one to create a substantially fault-free, monocrystalline and/or epitaxial layer, which grows beyond the mask 6, but rather also a layer with enclosed structures, particularly dots. If the order of magnitude of these structures lies in the nanometre range, then one speaks of nanodots. Nanostructures of this type are required, in order to create semiconductor components with very specific properties, particularly properties based on quantum-mechanical effects. The nanodots are therefore the dots of the monocrystalline and/or epitaxial layer, which are surrounded by the mask imprinted according to the invention. Nanowires constitute a special case. These nanowires can be formed under certain conditions by means of a continued upward growth of the monocrystalline and/or epitaxial layer out of the aperture. The monocrystalline and/or epitaxial layer therefore does not recombine laterally to form a layer when the mask surface is reached, rather the growth thereof continues unhindered normally to the mask surface.

Also conceivable is the exclusive use of the seeded, monocrystalline and/or epitaxial, particularly defect-free overgrowth layer 14 without the included mask 6. In order to remove the mask 6 from the overgrowth layer 14, the side with the less perfect seed layer 2 is preferably removed.

Figure 1M:
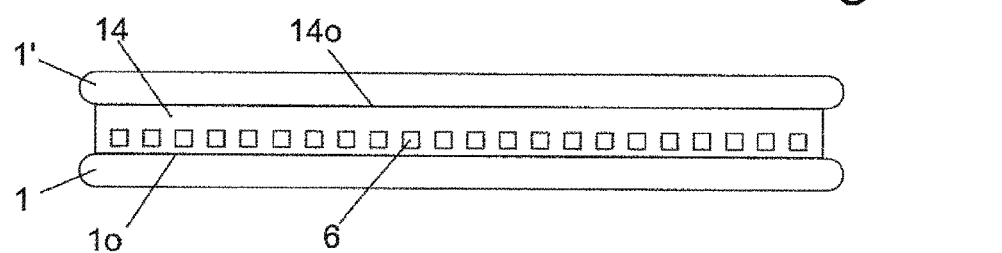
Figure 1N:
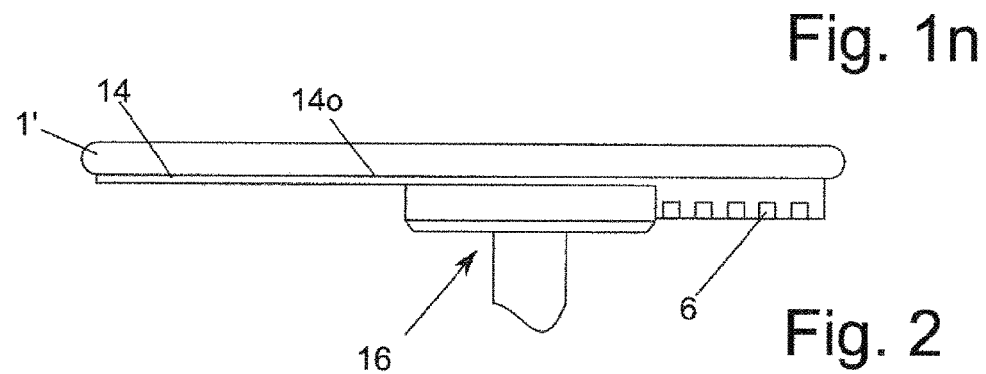

A processing of the overgrowth layer 14 can be imagined, followed by a subsequent bonding step of a second substrate 1' on the overgrowth layer surface 14o according to FIG. 1m.

After the bonding step has taken place, a removal of the first substrate 1, followed by an etching and/or polishing and/or back grinding process by means of a grinding device 16 at least of parts of the seed layer 2 and/or parts of the overgrowth layer 14, is conceivable. In this case, the complete mask 6 can be removed in particular. The removal of the substrate 1 is predominantly facilitated in that the seed layer 2 has a low adhesion to the substrate 1. A process flow, in which first a back grinding and/or polishing of the overgrowth layer 14 created according to the invention takes place, followed by an etching process. The final etching process is used on the one hand to relieve tension and on the other hand to remove a defective layer created by means of the grinding process.

Figure 2:
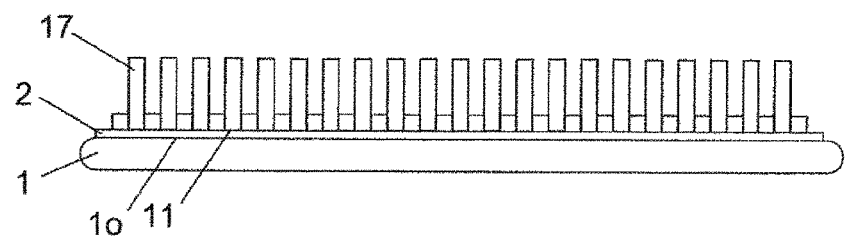

FIG. 2 shows a further side view according to the invention, which is not true to scale, of an embodiment of an end product, comprising a plurality of nanowires 17, which grow out of the mask passages 11. In contrast with other embodiments according to the invention, the nanowires 17 do not recombine laterally to form an overgrowth layer, but rather grow, particularly exclusively, upwards.

REFERENCE LIST 1, 1' Substrate
1o Substrate surface
2 Seed layer
2o Seed layer surface
3 Mask material
4 (Imprint) stamp
5 Stamp structure
5o Stamp structure surface
6 Mask
7 Coating system
8 Material flow
8m Coating material 9 Crystallographic plane (hkl)
10 Lattice structure faults, particularly dislocation
11 Mask passages
12 Residual layer
13, 13' Gases
14 Overgrowth layer
14o Overgrowth layer surface
15 End product
16 Grinding device
17 Nanowire
K1, K2, K3 Seed plane
h1, h2 Height
t Depth
d Diameter Having described the invention, the following is claimed:

1. A method for applying a masked overgrowth layer onto a seed layer for producing semiconductor components, wherein a mask for masking the overgrowth layer is imprinted onto the seed layer, the method comprising:
providing a substrate with a seed layer having a seed layer surface;
applying a mask material onto the seed layer surface, the mask material being at least one of a liquid and a sol-gel;
positioning an imprint stamp above the deposited mask material;
structuring the mask material by contacting the imprint stamp with the mask material;
curing the mask material;
demoulding of the imprint stamp to form a mask having mask passages, said demoulding including removing the imprint stamp from contact with the mask material;
etching a residual layer of the mask material to expose the seed layer surface in the mask passages, the residual layer of the mask material being present in the mask passages after the demoulding of the imprint stamp;
coating the seed layer surface exposed in the mask passages with a coating material; and
growing the coating material to form an overgrowth layer that encloses the mask, the overgrowth layer having a desired height to obtain a desired end product with a defined thickness or a defined layer.

2. The method according to claim 1, wherein the method includes forming the seed layer and/or the overgrowth layer epitaxially and/or in a monocrystalline manner from one or more of the following materials as a seed layer material and/or the coating material for the overgrowth layer:
metals;
semiconductors; and
compound semiconductors.

3. The method according to claim 2, wherein:
the metals are selected from Cu, Ag, Au, Al, Fe, Ni, Co, Pt, W, Cr, Pb, Ti, Sn and/or Zn;
the semiconductors are selected from Ge, Si, alpha-Sn, fullerenes, B, Se, and Te; and
the compound semiconductors are selected from GaAs, GaN, InP, $In_xGaN$, InSb, InAs, GaSb, AlN, InN, GaP, BeTe, ZnO, $CuInGaSe_2$, ZnS, ZnSe, ZnTe, CdS, CdSe, CdTe, $HgCd_{(x)}Te$, BeSe, HgS, $Al_xGaAs$, GaS, GaSe, GaTe, InS, InSe, InTe, $CuInSe_2$, $CuInS_2$, $CuInGaS_2$, SiC, and SiGe.

4. The method according to claim 2, wherein identical materials are used as the seed layer material and the coating material for the overgrowth layer.

5. The method according to claim 1, wherein the mask material has a main component and a secondary component with one or more of the following main components:
silesquioxane, and/or
polyhedral oligomeric silesquioxane (POSS), and/or
polydimethylsiloxane (PDMS), and/or
tetraethyl orthosilicate (TEOS), and/or
poly(organo)siloxanes (silicone), and/or
perfluoropolyether (PFPE).

6. The method according to claim 5, wherein the mask material is applied onto the seed layer surface by a wet-chemical deposition method.

7. The method according to claim 1, wherein the mask material is structured to form the mask by means of imprint lithography.

8. The method according to claim 7, wherein the imprint lithography is nano imprint lithography.

9. The method according to claim 1, wherein the seed layer is coated with the overgrowth layer in a coating region of the seed layer surface not covered by the mask after application of the mask.

10. The method according to claim 1, wherein the overgrowth layer is formed beyond the mask.

11. The method according to claim 1, wherein the method further comprises at least partially removing the seed layer after formation of the overgrowth layer.

12. The method according to claim 11, wherein the seed layer is at least partially removed by abrading.

13. An end product, comprising:
a seed layer for producing semiconductor components on which a cured mask material of at least one of a liquid and a sol-gel is disposed; and
a masked overgrowth layer on the seed layer that encloses the cured mask material, the masked overgrowth layer having a lower dislocation density than the seed layer.

14. A method for applying a masked overgrowth layer onto a seed layer for producing semiconductor components, wherein a mask for masking the overgrowth layer is imprinted onto the seed layer, the method comprising:
providing a substrate with a seed layer having a seed layer surface;
applying a mask material onto the seed layer surface, the mask material being a sol-gel;
positioning an imprint stamp above the deposited mask material;
structuring the mask material by contacting the imprint stamp with the mask material;
curing the mask material;
demoulding of the imprint stamp to form a mask having mask passages, said demoulding including removing the imprint stamp from contact with the mask material;
etching a residual layer of the mask material to expose the seed layer surface in the mask passages, the residual layer of the mask material being present in the mask passages after the demoulding of the imprint stamp;
coating the seed layer surface exposed in the mask passages with a coating material; and
growing the coating material to form an overgrowth layer that encloses the mask, the overgrowth layer having a desired height to obtain a desired end product with a defined thickness or a defined layer.

* * * * *